(12) United States Patent
Bai et al.

(10) Patent No.: US 12,495,536 B2
(45) Date of Patent: Dec. 9, 2025

(54) SEMICONDUCTOR STRUCTURE AND METHOD FOR FORMING SAME

(71) Applicant: Changxin Memory Technologies, Inc., Anhui (CN)

(72) Inventors: Shijie Bai, Hefei (CN); Yexiao Yu, Hefei (CN); Zhongming Liu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 784 days.

(21) Appl. No.: 17/828,232

(22) Filed: May 31, 2022

(65) Prior Publication Data

US 2022/0392902 A1   Dec. 8, 2022

(30) Foreign Application Priority Data

Jun. 2, 2021   (CN) .................. 202110613584.X

(51) Int. Cl.
*H10B 12/00* (2023.01)
*G11C 11/408* (2006.01)

(52) U.S. Cl.
CPC ...... *H10B 12/0335* (2023.02); *G11C 11/4085* (2013.01); *H10B 12/09* (2023.02); *H10B 12/488* (2023.02)

(58) Field of Classification Search
CPC ........... G11C 11/4085; H01L 21/76805; H01L 21/76877; H01L 21/76895; H01L 23/481; H10B 12/0335; H10B 12/09; H10B 12/488
See application file for complete search history.

(56) References Cited

U.S. PATENT DOCUMENTS

| | | | |
|---|---|---|---|
| 6,071,799 A * | 6/2000 | Park | H01L 21/76844 257/E21.507 |
| 2004/0259298 A1* | 12/2004 | Graf | H10B 12/09 438/257 |

FOREIGN PATENT DOCUMENTS

CN   111430231 A   7/2020

* cited by examiner

*Primary Examiner* — Britt Hanley
*Assistant Examiner* — Kevin Quinto
(74) *Attorney, Agent, or Firm* — Sheppard Mullin Richter & Hampton LLP

(57) ABSTRACT

A semiconductor structure and the method for forming the same are provided. The method includes: providing a substrate including an active region; forming a word line in the substrate including a first portion and a second portion located at the end of the first portion, wherein the second portion of the word line protrudes from the first portion of the word line along the direction perpendicular to the substrate; forming a dielectric layer covering the substrate; and etching the dielectric layer and a part of the substrate to simultaneously form a first contact hole exposing the second portion of the word line and a second contact hole exposing the active region. The invention reduces the etching time and improves the etching efficiency. It avoids an excessively large etching depth of the second contact hole, thereby reducing the damage to the active region and the leakage current inside the semiconductor structure.

12 Claims, 9 Drawing Sheets

SEMICONDUCTOR STRUCTURE AND METHOD FOR FORMING SAME

CROSS-REFERENCE TO RELATED APPLICATION

This application claims priority to Chinese Patent Application No.: 202110613584.X, filed on Jun. 2, 2021. The above-referenced application is incorporated herein by reference in its entirety.

TECHNICAL FIELD

The invention generally relates to the technical field of semiconductor fabrication and, more particularly, to a semiconductor structure and a method for forming the same.

BACKGROUND

Dynamic random access memory (DRAM) is a semiconductor structure commonly used in electronics such as computers. An active region, a peripheral gate region, a bit line, and a word line in the DRAM are all electrically connected to a peripheral circuit (PC) via a contact plug to transmit electrical signals. To simplify the manufacturing process, the active region, the peripheral gate region, the bit line, and the word line are typically simultaneously etched, so as to simultaneously form, in each region, contact holes connected to the peripheral circuit. Therefore, the etching of the contact hole connecting the word line and the peripheral circuit will increase the etching depth of the contact hole connecting the active region and the peripheral circuit, thereby increasing the leakage current. Further, it will increase the etching depth of the contact hole connecting the bit line and the peripheral circuit, thereby causing penetration of the oxide layer under the bit line, affecting the electrical isolation performance of the oxide layer, and an increase of resistive-capacitive (RC) delay effect.

Therefore, reducing the damage to the active region and the bit line when forming the contact hole connecting the word line and the peripheral circuit, increasing the yield and improving the electrical performance of the semiconductor structure are urgent problems to be solved.

SUMMARY

The embodiments of the invention provide a semiconductor structure and a method for forming the semiconductor structure. The disclosed method reduces the damages caused to other regions when forming a contact hole connecting a word line and a peripheral circuit, and improves the electrical performance and the yield of the semiconductor structure.

One aspect of the invention is directed to a method for forming a semiconductor structure. The method may include: providing a substrate including an active region; forming a word line in the substrate including a first portion and a second portion located at the end of the first portion, wherein the second portion of the word line protrudes from the first portion of the word line along the direction perpendicular to the substrate; forming a dielectric layer covering the substrate; and etching the dielectric layer and a part of the substrate to simultaneously form a first contact hole exposing the second portion of the word line and a second contact hole exposing the active region.

Another aspect of the invention is directed to a semiconductor structure. The semiconductor structure may include: a substrate including an active region; a word line in the substrate including a first portion and a second portion located at the end of the first portion, wherein the second portion of the word line protrudes from the first portion of the word line along the direction perpendicular to the substrate; a dielectric layer covering the substrate; a first contact plug penetrating the dielectric layer and a part of the substrate and in contact with the second portion of the word line; and a second contact plug penetrating at least the dielectric layer and in contact with the active region.

According to the semiconductor structure and the method for forming the same provided in the embodiments of the invention, the word line is arranged to include the first portion and the second portion located at the end of the first portion, and the second portion of the word line protrudes from the first portion of the word line along the direction perpendicular to the substrate (i.e., the top surface of the second portion of the word line is higher than that of the first portion of the word line).

DETAILED DESCRIPTION OF THE EMBODIMENTS

The semiconductor structure and the method for forming the semiconductor structure provided in the embodiments of the invention are described in detail below with reference to the accompanying drawings.

Figure 1:
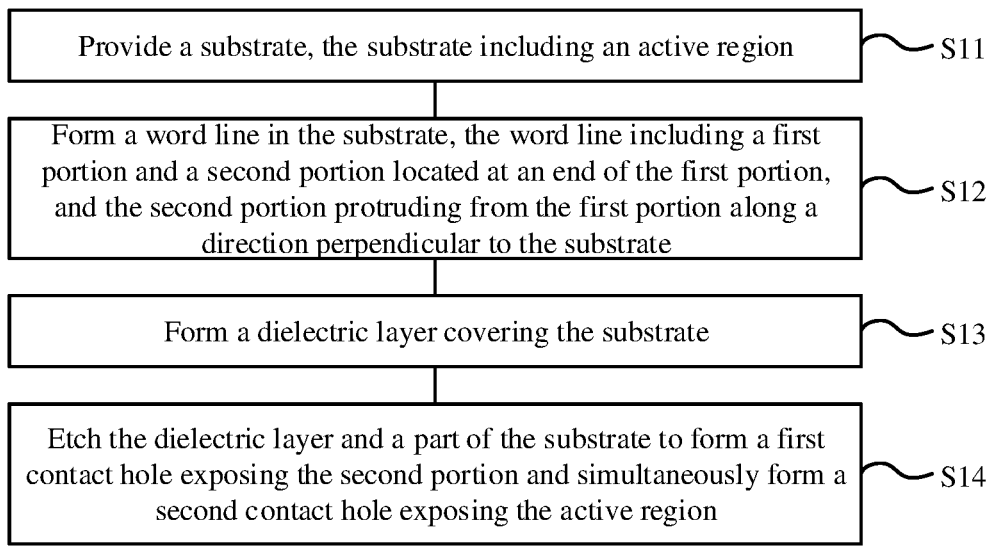
FIG. 1 is a schematic flowchart of a method for forming a semiconductor structure according to the embodiments of the invention.

The embodiments of the invention provide a semiconductor structure. FIG. 1 is a schematic flowchart of a method for forming a semiconductor structure according to the embodiments of the invention. FIGS. 2A to 2M are schematic diagrams of semiconductor structures in the process of forming a semiconductor structure according to the embodiments of the invention. Referring to FIG. 1, and FIGS. 2A to 2M, the method for forming the semiconductor structure may include the following steps.

Figure 2A:
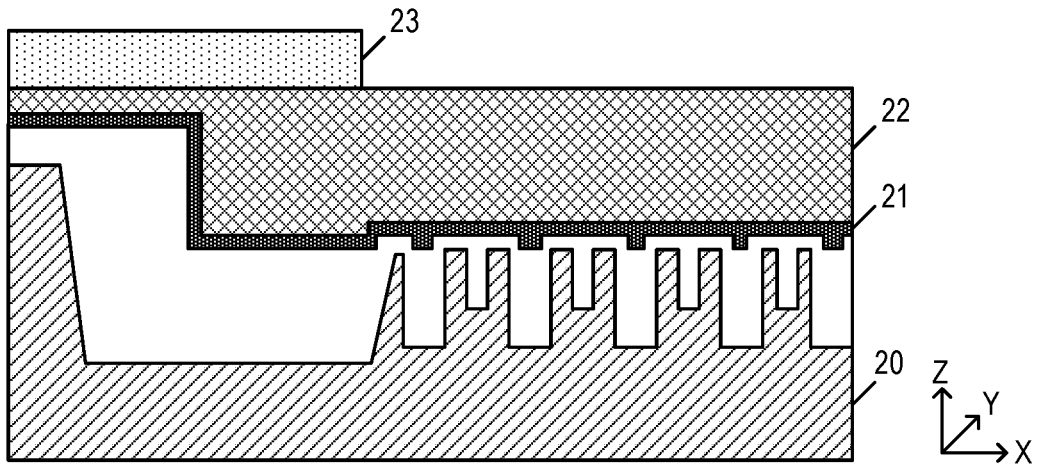
FIGS. 2A, 2B, 2C, 2D, 2E, 2F, 2G, 2H, 2I, 2J, 2K, 2L, and 2M are schematic diagrams of semiconductor structures in the process of forming a semiconductor structure according to the embodiments of the invention.
Figure 2B:
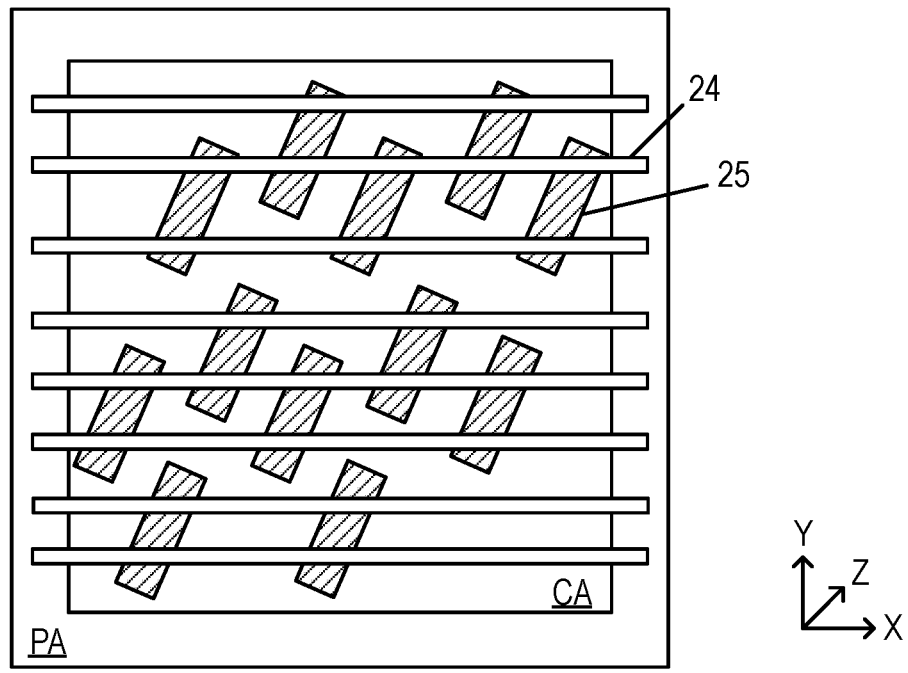

In step S11, a substrate 20 may be provided. The substrate 20 may include an active region 25, as shown in FIG. 2A and FIG. 2B. FIG. 2B is the top view of the semiconductor structure of FIG. 2A.

The substrate 20 may be, but is not limited to, a silicon substrate. In some embodiments, the substrate 20 may be a silicon substrate. In some other embodiments, the substrate 20 may be a gallium nitride substrate, a gallium arsenide substrate, a gallium carbide substrate, a silicon carbide substrate, or a silicon-on-insulator (SOI) substrate. The substrate 20 may further include a plurality of active regions 25 arranged in an array and isolated from each other by shallow trench isolation structures.

In step S12, a word line in the substrate 20 may be formed. The word line may include a first portion of the word line 28 and a second portion of the word line 29 located at the end of the first portion of the word line 28. The second portion of the word line 29 may protrude from the first portion of the word line 28 along the direction perpendicular to the substrate 20, as shown in FIG. 2I and FIG. 2J. FIG. 2J is the top view of the semiconductor structure of FIG. 2I.

The second portion of the word line 29 protruding from the first portion of the word line 28 along the direction perpendicular to the substrate 20 means that, along the direction perpendicular to the substrate 20, the top surface of the second portion of the word line 29 is above the top surface of the first portion of the word line 28 (i.e., the top surface of the second portion of the word line 29 is higher than the top surface of the first portion of the word line 28). The bottom surface of the second portion of the word line 29 may be lower than the bottom surface of the first portion of the word line 28, or the bottom surface of the second portion of the word line 29 may be flush with the bottom surface of the first portion of the word line 28.

In some embodiments, the substrate 20 may include a cell area (CA) and a peripheral area (PA) located outside the cell area (CA), and the active region may be located in the cell area (CA) of the substrate 20. Forming the word line in the substrate 20 may include: etching the substrate 20 to form a groove 24 extending across the cell area (CA) and to the peripheral area (PA) along the first direction parallel to the substrate 20, as shown in FIG. 2B; and filling the groove 24 with a conductive material to form the first portion of the word line 28 in the cell area (CA) and the second portion of the word line 29 in the peripheral area (PA), as shown in FIG. 2I and FIG. 2J.

The peripheral area (PA) may be distributed around the cell area (CA). The substrate 20 may be etched from the surface of the substrate 20 along the direction perpendicular to the substrate 20 (for example, the Z-axis direction in FIG. 2B), to form the groove 24 that does not extend across the substrate 20. Along the first direction parallel to the surface of the substrate 20 (for example, the X-axis direction in FIG. 2B), the groove 24 may extend across the cell area (CA) and to the peripheral area (PA). A plurality of grooves 24 may be arranged in parallel along a second direction parallel to the surface of the substrate 20 (for example, the Y-axis direction in FIG. 2B). The groove 24 may be filled with a conductive material such as tungsten to form the first portion of the word line 28 in the cell area (CA) and the second portion of the word line 29 in the peripheral area (PA), as shown in FIG. 2I and FIG. 2J.

Figure 2C:
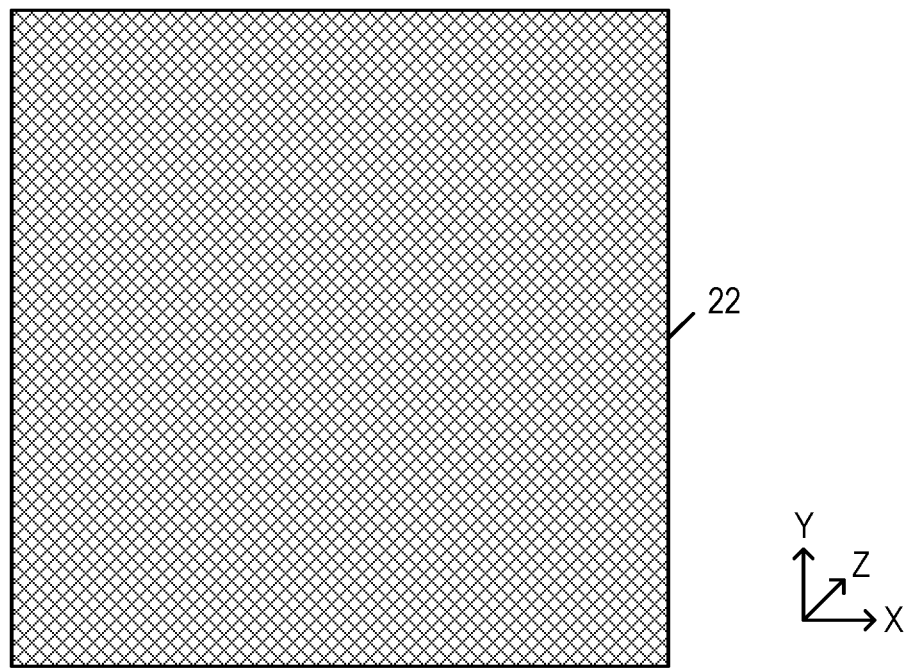

In some embodiments, forming the first portion of the word line 28 in the cell area (CA) and the second portion of the word line 29 in the peripheral area (PA) may include: depositing a first conductive material in the groove 24 and on the surface of the substrate 20 to form a conductive layer 22 covering the cell area (CA) and the peripheral area (PA), as shown in FIG. 2C; and etching the conductive layer 22 to form the first portion of the word line 28 and the second portion of the word line 29.

Figure 2D:
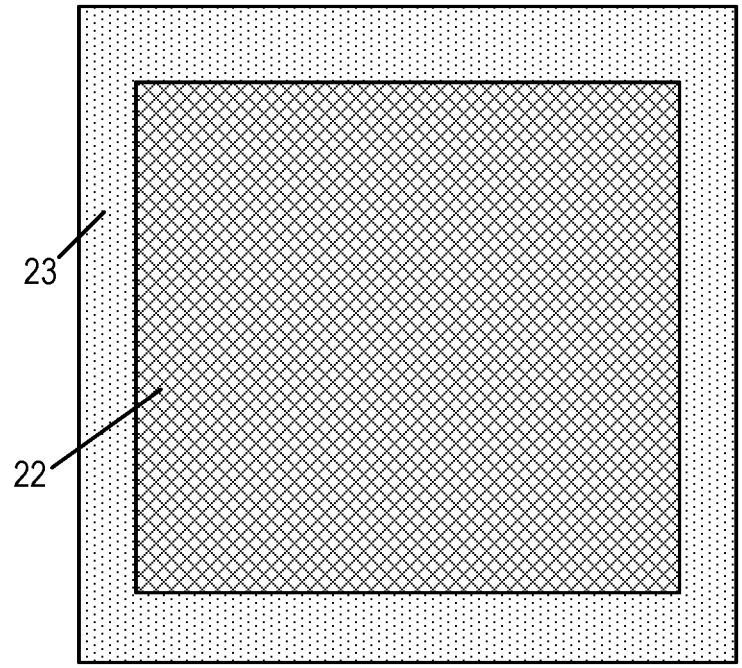
Figure 2E:
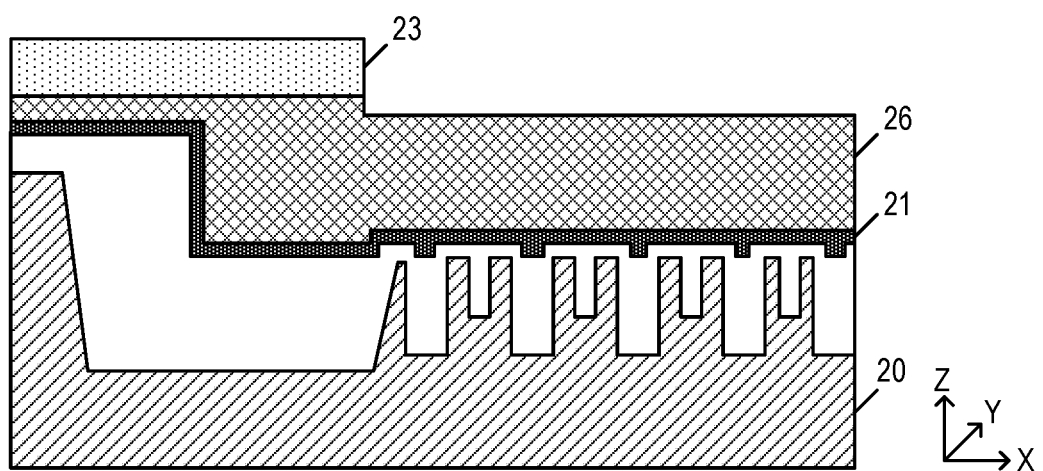
Figure 2F:
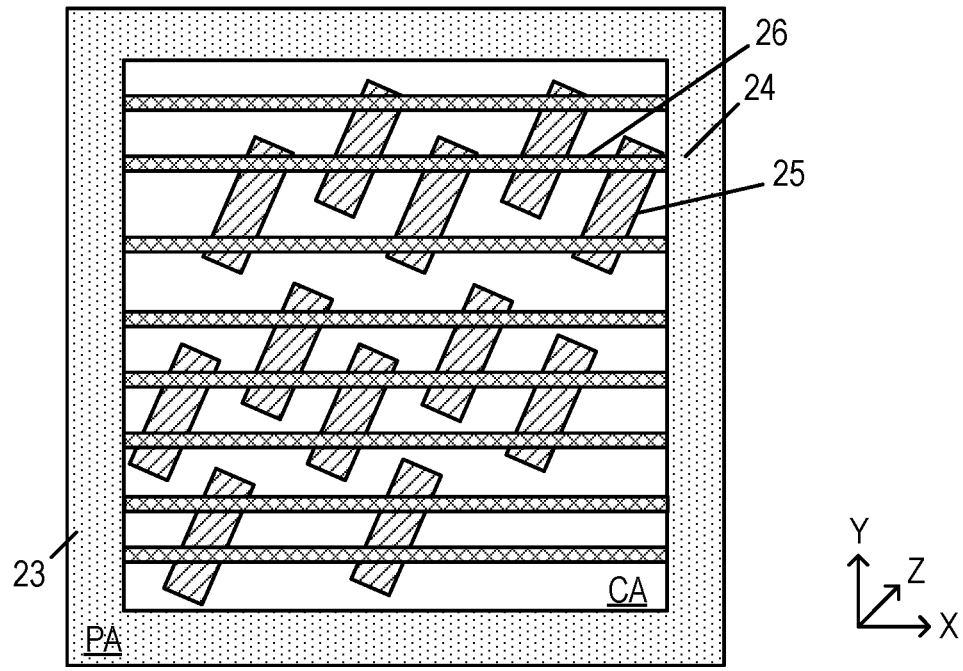
Figure 2G:
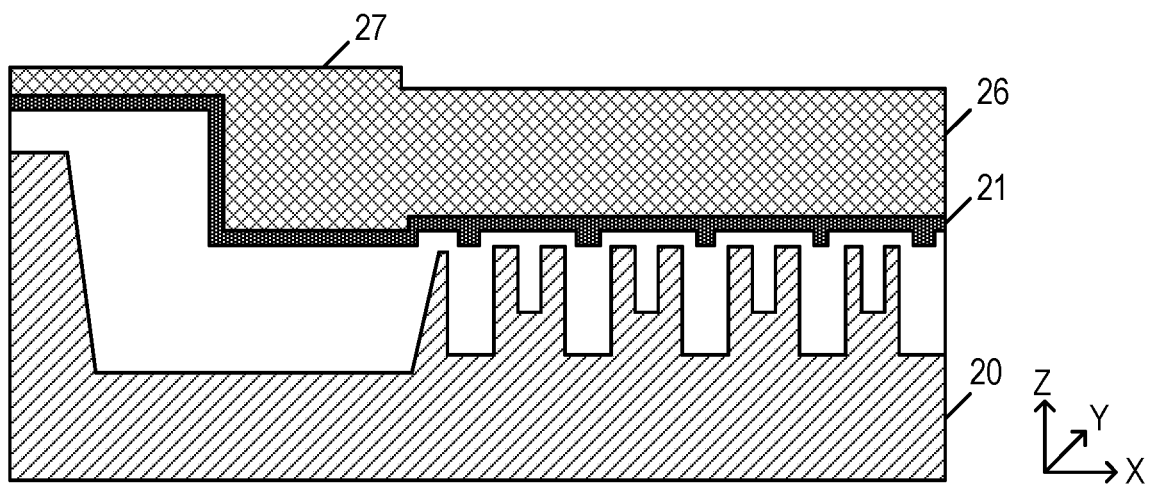
Figure 2H:
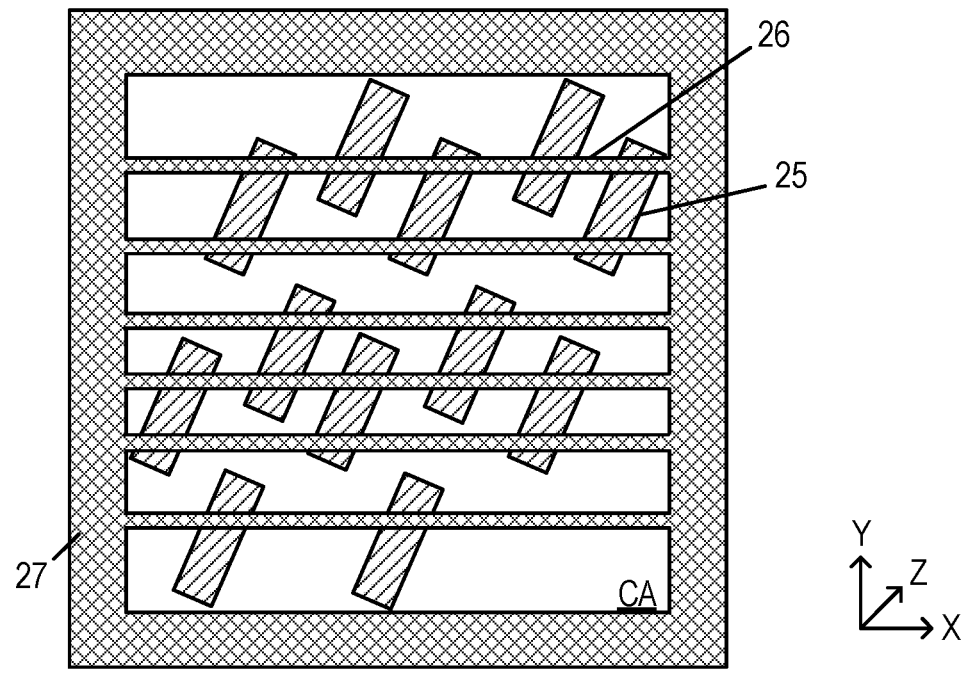
Figure 2I:
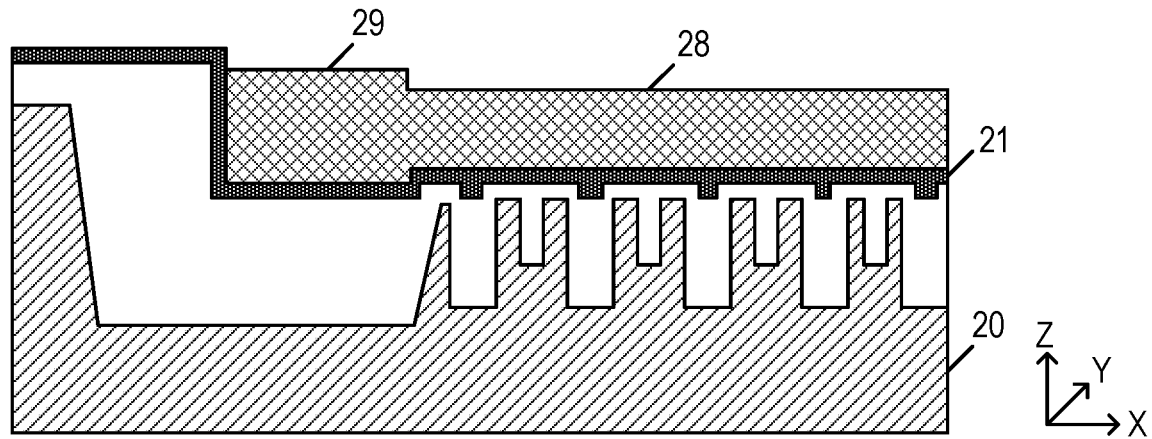
Figure 2J:
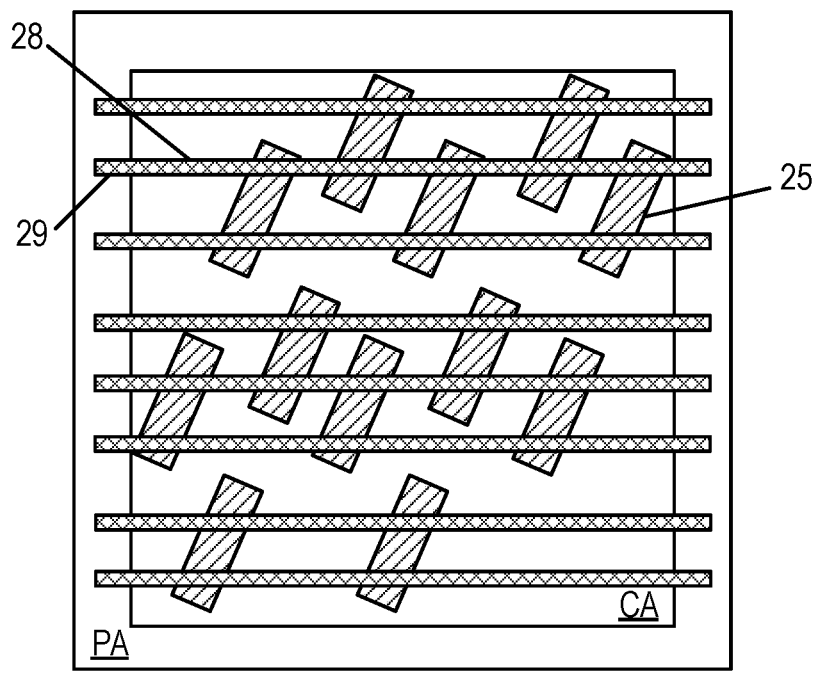

In some embodiments, etching the conductive layer 22 may include: forming a shielding layer 23 covering the surface of the conductive layer 22 located in the peripheral area (PA), as shown in FIG. 2A and FIG. 2D (FIG. 2D is the other top view of the semiconductor structure of FIG. 2A); removing a part of the conductive layer 22 on the surface of the substrate 20 in the cell area (CA). The portion of the conductive layer 22 remaining in the cell area (CA) may serve as an initial first portion of the word line 26, and the portion of the conductive layer 22 remaining in the peripheral area (PA) may serve as an initial second portion of the word line 27, as shown in FIG. 2E, FIG. 2F, FIG. 2G, and FIG. 2H (FIG. 2F is the top view of the semiconductor structure of FIG. 2E, and FIG. 2H is the top view of the semiconductor structure of FIG. 2G).

Etching the conductive layer 22 may further include back-etching a part of the initial first portion of the word line 26 and a part of the initial second portion of the word line 27. The initial first portion of the word line 26 remaining in the groove 24 of the cell area (CA) may serve as the first portion of the word line 28, and the initial second portion of the word line 27 remaining in the groove 24 of the peripheral area (PA) may serve as the second portion of the word line 29, as shown in FIG. 2I and FIG. 2J.

In some embodiments, the peripheral area (PA) may be distributed around the cell area (CA). Forming the shielding layer 23 covering the surface of the conductive layer 22 located in the peripheral area (PA) may include depositing a photoresist material in the peripheral area (PA) to form the shielding layer 23. The shielding layer may cover the conductive layer 22 located in the peripheral area (PA) and expose the conductive layer 22 located in the cell area (CA).

After depositing the first conductive material in the groove 24 and on the surface of the substrate 20 to form the conductive layer 22 covering the cell area (CA) and the peripheral area (PA), a photoresist may be coated on the conductive layer 22 located in the peripheral area (PA) to form the shielding layer 23, as shown in FIG. 2A and FIG. 2D. Those skilled in the art may select other materials to form the shielding layer 23 based on actual needs, provided that the etch selectivity between the shielding layer 23 and the conductive layer 22 is relatively high. For example, the etch selectivity between the shielding layer 23 and the conductive layer 22 may be greater than 3. Next, by etching the conductive layer 22 exposed from the cell area (CA) and removing the conductive layer 22 outside the groove 24 and a part of the conductive layer 22 inside the groove 24, semiconductor structures as shown in FIG. 2E and FIG. 2F may be formed. After removing the shielding layer 23, semiconductor structures as shown in FIG. 2G and FIG. 2H may be obtained. Then, a part of the initial first portion of the word line 26 and a part of the initial second portion of the word line 27 are back-etched based on the required thickness of the word line. The portion of the initial first portion of the word line 26 remaining in the groove 24 of the cell area (CA) may serve as the first portion of the word line 28, and the portion of the initial second portion of the word line 27 remaining in the groove 24 of the peripheral area (PA) may serve as the second portion of the word line 29, as shown in FIG. 2I and FIG. 2J. In some embodiments, the word line formed may be a buried word line.

In the abovementioned embodiments, the first conductive material may be etched to form the first portion of the word line 28 and the second portion of the word line 29 after the first conductive material had been simultaneously deposited on the cell area (CA) and the peripheral area (PA). Those skilled in the art may also form the first portion of the word line 28 and the second portion of the word line 29 having different thicknesses directly through a deposition process without etching based on actual needs.

In some embodiments, before depositing the first conductive material in the groove 24 and on the surface of the substrate 20, the method may further include forming a diffusion barrier layer 21 on the inner wall of the groove 24.

The diffusion barrier layer 21 may be made of materials including, but not limited to, TiN. On the one hand, the diffusion barrier layer 21 may increase the adhesion between the first conductive material and the inner wall of the groove 24. On the other hand, the diffusion barrier layer 21 may prevent the diffusion of the conductive particles in the first conductive material into the substrate 20.

Figure 2K:
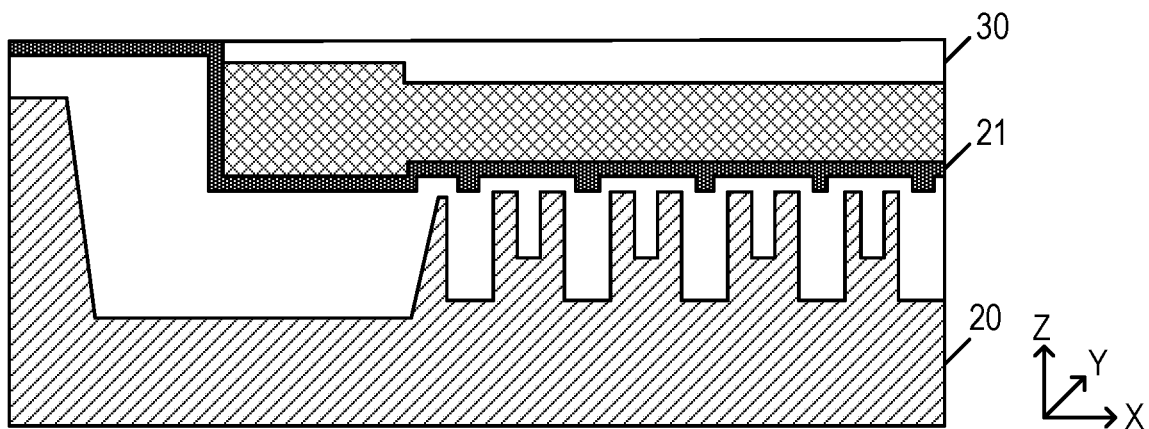
Figure 2L:
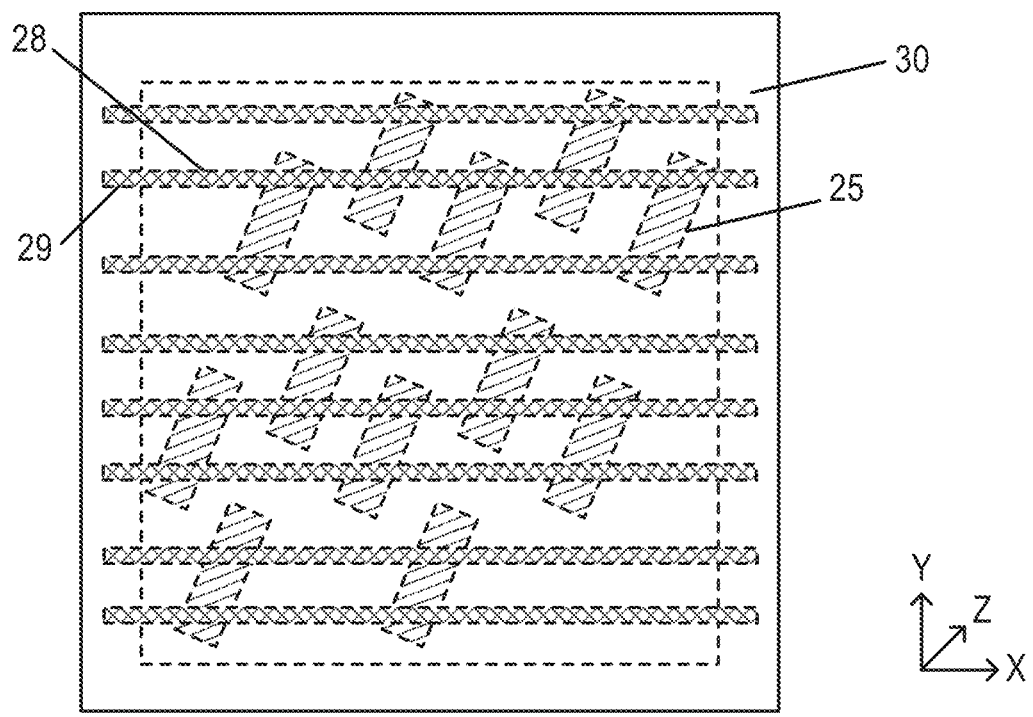

In step S13, a dielectric layer 30 covering the substrate 20 may be formed, as shown in FIG. 2K and FIG. 2L (FIG. 2L is the top view of the semiconductor structure of FIG. 2K). Referring to FIG. 2L, all of the active region 25, the first portion of the word line 28, and the second portion of the word line 29 are invisible, and thus the active region 25, the first portion of the word line 28, and the second portion of the word line 29 are indicated by dashed lines.

Figure 2M:
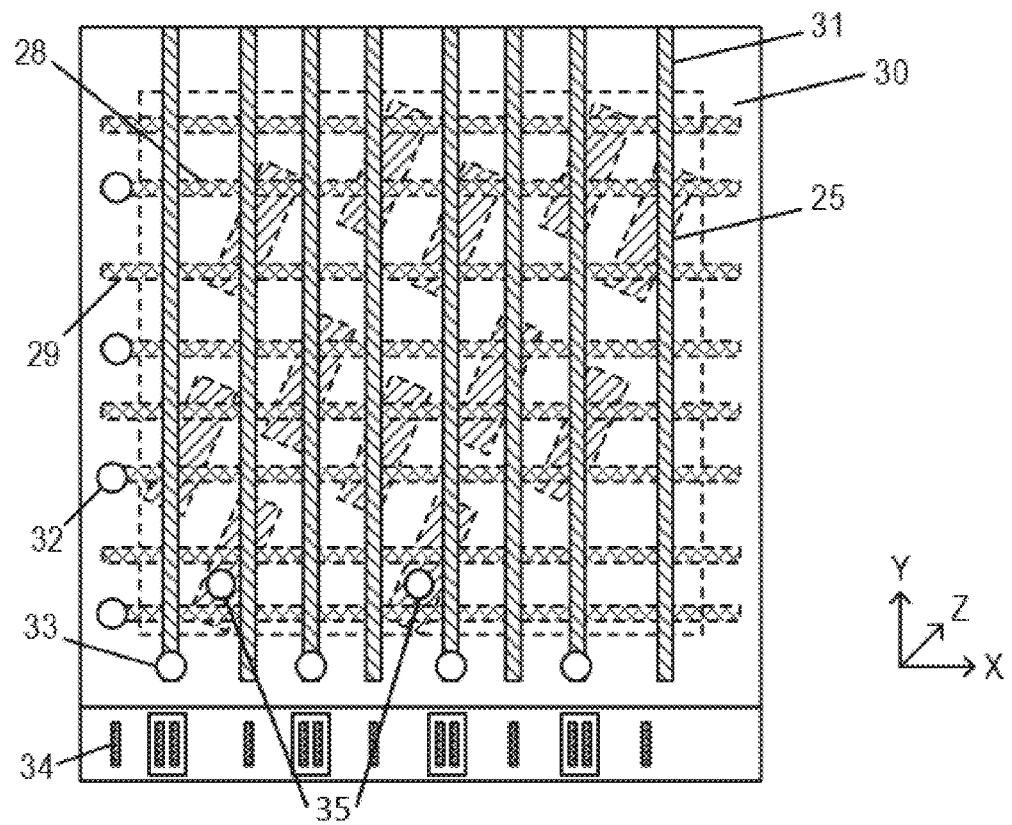

In some embodiments, before forming the dielectric layer 30 covering the substrate 20, the method may further include forming a bit line 31 on the substrate 20, as shown in FIG. 2M.

The bit line 31 may be located above the word line, and the extension direction of the bit line 31 may intersect with the extension direction of the word line. For example, the bit line 31 may extend along the Y-axis direction in FIG. 2M, and the word line may extend along the X-axis direction in FIG. 2M. A plurality of bit lines 31 may be arranged in parallel.

In some embodiments, forming the dielectric layer 30 covering the substrate 20 may include depositing a dielectric material on the substrate 20 to form the dielectric layer 30 covering the surface of the substrate 20 and the bit line 31. The dielectric layer 30 may be made of materials including, but not limited to, a nitride material, such as silicon nitride.

In step S14, the dielectric layer 30 and a part of the substrate 20 may be etched to simultaneously form a first contact hole 32 exposing the second portion of the word line 29 and a second contact hole 35 exposing the active region 25.

In some embodiments, simultaneously forming the first contact hole 32 exposing the second portion of the word line 29 and the second contact hole 35 exposing the active region 25 may include etching the dielectric layer 30 and the substrate 20 to simultaneously form the first contact hole 32 exposing the second portion of the word line 29, the second contact hole 35 exposing the active region 25, and a third contact hole 33 exposing the bit line 31.

In some embodiments, the bit line 31 may extend from the cell area (CA) to the peripheral area (PA), and the third contact hole 33 may expose the bit line 31 in the peripheral area (PA).

In some embodiments, after forming the dielectric layer 30, the dielectric layer 30 and a part of the substrate 20 may be etched to simultaneously form the first contact hole 32 exposing the second portion of the word line 29, the second contact hole 35 exposing the active region 25 in the substrate 20, the third contact hole 33 exposing the bit line 31 in the peripheral area (PA), and a fourth contact hole 34 exposing a peripheral gate in the peripheral area (PA).

Since the second portion of the word line 29 protrudes from the first portion of the word line 28, the etching time in forming the first contact hole 32 can be shortened, the over etching of the active region 25, the bit line 31, and the peripheral gate can be effectively avoided, and the damage to the active region 25, the bit line 31, and the peripheral gate can be reduced, thereby reducing the leakage current within the semiconductor structure. In addition, because the second portion of the word line 29 protrudes from the first portion of the word line 28, the second portion of the word line 29 may further be over-etched to increase the contact area between a first contact plug subsequently formed in the first contact hole 32 and the word line, thereby reducing the RC delay effect.

In some embodiments, the method for forming a semiconductor structure may further include filling the first contact hole 32, the second contact hole 35, and the third contact hole 33 with a second conductive material, and simultaneously forming a first contact plug in contact with the second portion of the word line 29, a second contact plug in contact with the active region 25, and a third contact plug in contact with the bit line 31.

The second conductive material may be the same as the first conductive material, such as tungsten.

In some embodiments, the method for forming a semiconductor structure may further include forming a first peripheral circuit electrically connected to the first contact plug, a second peripheral circuit electrically connected to the second contact plug, and a third peripheral circuit electrically connected to the third contact plug.

The difference between the thickness of the second portion of the word line 29 and the thickness of the first portion of the word line 28 should be sufficiently large, so as to provide sufficient protection for the active region and the bit line 31. On the other hand, the difference between the thickness of the second portion of the word line 29 and the thickness of the first portion of the word line 28 should not be too large either, so as to avoid an unnecessary increase in the internal resistance of the semiconductor structure. In some embodiments, the ratio of the thickness of the second portion of the word line 29 to the thickness of the first portion of the word line 28 may range from 7:4 to 7:6. For example, if the thickness of the second portion of the word line 29 is 140 nm, the thickness of the corresponding first portion of the word line 28 may range from 80 nm to 120 nm.

Figure 3A:
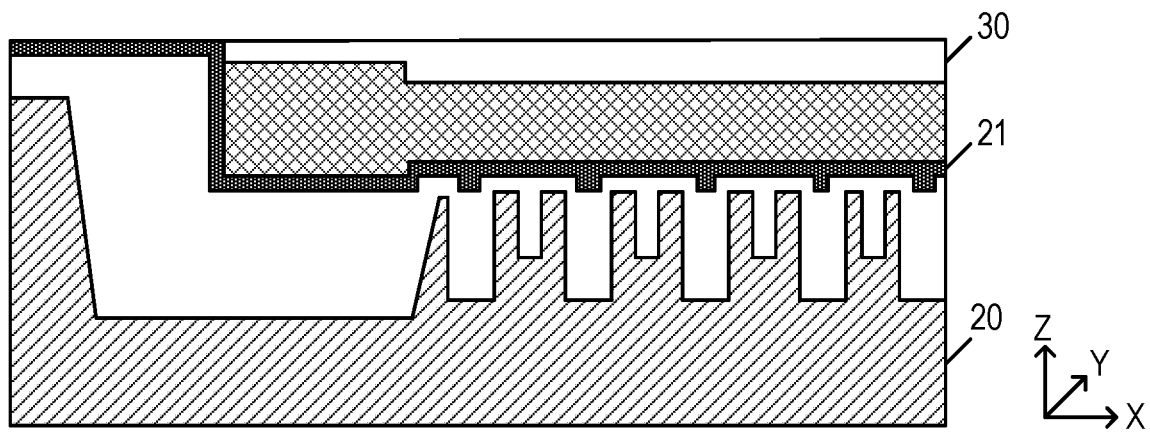
FIGS. 3A, 3B and 3C are schematic diagrams of a semiconductor structure according to the embodiments of the invention.
Figure 3B:
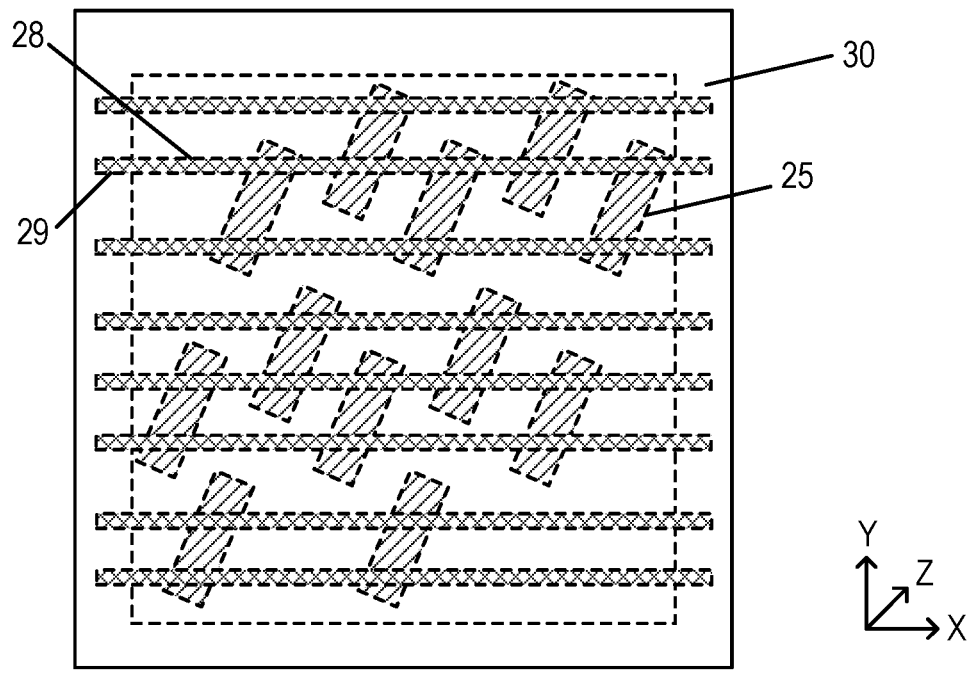
Figure 3C:
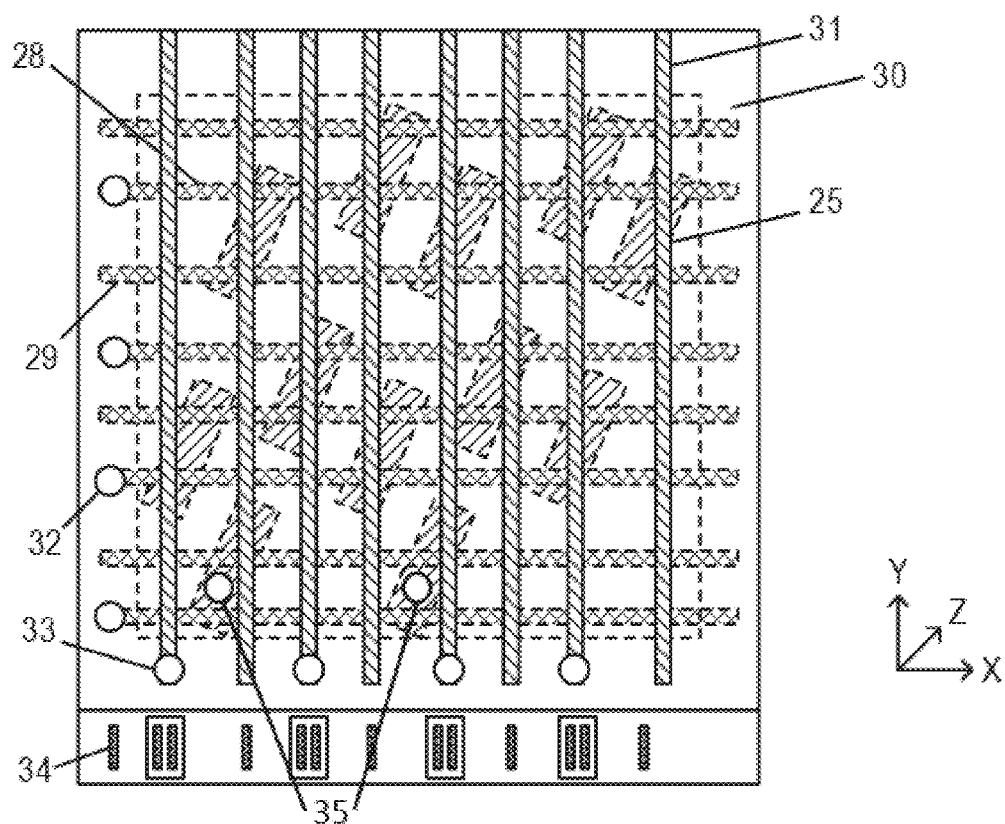

The embodiments of the invention further provide a semiconductor structure. FIG. 3A to FIG. 3C are schematic diagrams of a semiconductor structure according to the embodiments of the invention. The semiconductor structure may be formed using the method for forming a semiconductor structure as shown in FIG. 1, and FIG. 2A to FIG. 2M. Referring to FIG. 3A to FIG. 3C, the semiconductor structure may include: a substrate 20 including an active region 25; a word line in the substrate 20 including a first portion of the word line 28 and a second portion of the word line 29 located at the end of the first portion of the word line 28, wherein the second portion of the word line 29 protrudes from the first portion of the word line 28 along the direction perpendicular to the substrate 20; a dielectric layer 30 covering the substrate 20; a first contact plug penetrating the dielectric layer 30 and a part of the substrate 20 and in contact with the second portion of the word line 29; and a second contact plug penetrating at least the dielectric layer 30 and in contact with the active region 25.

In some embodiments, the substrate 20 may include a cell area (CA) and a peripheral area (PA) located outside the cell area (CA), and the active region 25 may be located in the cell area (CA) of the substrate 20. The first portion of the word line 28 may be located in the cell area (CA), and the second portion of the word line 29 may be located in the peripheral area (PA).

In some embodiments, the semiconductor structure may further include: a groove 24 located in the substrate 20; a diffusion barrier layer 21 covering the inner wall of the groove 24; and a word line located on the surface of the diffusion barrier layer 21 and filling the groove 24.

In some embodiments, the semiconductor structure may further include a bit line 31 located on the substrate 20. The dielectric layer 30 may cover the surface of the substrate 20 and the bit line 31.

In some embodiments, the semiconductor structure may further include a third contact plug penetrating at least the dielectric layer 30 and in contact with the bit line 31.

In some embodiments, the bit line 31 may extend from the cell area (CA) to the peripheral area (PA). The third contact plug may be in contact with the bit line 31 located in the peripheral area (PA).

In some embodiments, the semiconductor structure may further include a first peripheral circuit, a second peripheral circuit, and a third peripheral circuit. The first contact plug may have one end in contact with the second portion of the word line 29, and the other end electrically connected to the first peripheral circuit. The second contact plug may have one end in contact with the active region 25, and the other end electrically connected to the second peripheral circuit. The third contact plug may have one end in contact with the bit line 31, and the other end electrically connected to the third peripheral circuit.

In some embodiments, the thickness of the second portion of the word line 29 may be 1.2 to 5 times that of the first portion of the word line 28.

According to the semiconductor structure and the method for forming the same provided in the embodiments of the invention, the word line is arranged to include the first portion and the second portion located at the end of the first portion, and the second portion of the word line protrudes from the first portion of the word line along the direction perpendicular to the substrate (i.e., the top surface of the second portion of the word line is higher than that of the first portion of the word line). On the one hand, the etching time can be reduced and the etching efficiency can be improved when forming the first contact hole exposing the word line. On the other hand, the etching depth exposing the word line can be reduced. That avoids an excessively large etching depth of the second contact hole exposing the active region, thereby reducing the damage to the active region and the leakage current inside the semiconductor structure, and improving the electrical performance and the yield of the semiconductor structure.

The foregoing description is only preferred implementations of the invention, and it should be noted that for those of ordinary skill in the art, some improvements and modifications may further be made without departing from the principle of the invention, and these improvements and modifications shall also be construed to be within the scope of protection of the invention.

What is claimed is:

1. A method for forming a semiconductor structure, comprising:
   providing a substrate, the substrate comprising an active region;
   forming a word line in the substrate, the word line comprising a first portion and a second portion located at an end of the first portion, wherein the second portion of the word line protrudes from the first portion of the word line along a direction perpendicular to the substrate;
   forming a dielectric layer covering the substrate; and
   etching the dielectric layer and a part of the substrate to simultaneously form a first contact hole exposing the second portion of the word line and a second contact hole exposing the active region, wherein before forming the dielectric layer covering the substrate, the method further comprises forming a bit line on the substrate.

2. The method of claim 1, wherein a ratio of a thickness of the second portion of the word line to a thickness of the first portion of the word line ranges from (7:4) to (7:6).

3. The method of claim 1, wherein the substrate comprises a cell area and a peripheral area located outside the cell area, and the active region is located in the cell area of the substrate; and wherein forming the word line in the substrate comprises:
   etching the substrate to form a groove extending across the cell area and to the peripheral area along a first direction parallel to the substrate; and
   filling the groove with a conductive material to form the first portion of the word line in the cell area and the second portion of the word line in the peripheral area.

4. The method of claim 3, wherein forming the first portion of the word line in the cell area and the second portion of the word line in the peripheral area comprises:
   depositing a first conductive material in the groove and on a surface of the substrate to form a conductive layer covering the cell area and the peripheral area; and
   etching the conductive layer to form the first portion of the word line and the second portion of the word line.

5. The method of claim 4, wherein etching the conductive layer comprises:
   forming a shielding layer covering a surface of the conductive layer located in the peripheral area;
   removing a part of the conductive layer on the surface of the substrate in the cell area, wherein a portion of the conductive layer remaining in the cell area serves as an initial first portion of the word line, and a portion of the conductive layer remaining in the peripheral area serves as an initial second portion of the word line; and
   back-etching a part of the initial first portion of the word line and a part of the initial second portion of the word line, wherein a portion of the initial first portion of the word line remaining in the groove of the cell area serves as the first portion of the word line, and a portion of the initial second portion of the word line remaining in the groove of the peripheral area serves as the second portion of the word line.

6. The method of claim 4, wherein before depositing the first conductive material in the groove and on the surface of the substrate, the method further comprises:
   forming a diffusion barrier layer on an inner wall of the groove.

7. The method of claim 5, wherein the peripheral area is distributed around the cell area, and wherein forming the shielding layer covering the surface of the conductive layer located in the peripheral area comprises:
   depositing a photoresist material in the peripheral area to form the shielding layer, the shielding layer covering the conductive layer located in the peripheral area and exposing the conductive layer located in the cell area.

8. The method of claim 1, wherein forming the dielectric layer covering the substrate comprises:
   depositing a dielectric material on the substrate to form the dielectric layer covering a surface of the substrate and the bit line.

9. The method of claim 8, wherein simultaneously forming the first contact hole exposing the second portion of the word line and the second contact hole exposing the active region comprises:
   etching the dielectric layer and the substrate to simultaneously form the first contact hole exposing the second portion of the word line, the second contact hole exposing the active region, and a third contact hole exposing the bit line.

10. The method of claim 9, wherein the substrate comprises a cell area and a peripheral area located outside the cell area, the bit line extends from the cell area to the peripheral area, and wherein the third contact hole exposes the bit line in the peripheral area.

11. The method of claim 9, further comprising:
filling the first contact hole, the second contact hole, and the third contact hole with a second conductive material, and simultaneously forming a first contact plug in contact with the second portion of the word line, a second contact plug in contact with the active region, and a third contact plug in contact with the bit line.

12. The method of claim 11, further comprising:
forming a first peripheral circuit electrically connected to the first contact plug, a second peripheral circuit electrically connected to the second contact plug, and a third peripheral circuit electrically connected to the third contact plug.

* * * * *